United States Patent [19]

Hung et al.

[11] Patent Number: 4,615,950
[45] Date of Patent: Oct. 7, 1986

[54] PRINTED CIRCUIT BOARDS HAVING IMPROVED ADHESION BETWEEN SOLDER MASK AND METAL

[75] Inventors: Paul L. K. Hung, Edison; Richard J. Radigan, Toms River; David S. Rosen, Avenel, all of N.J.

[73] Assignee: M&T Chemicals Inc., Woodbridge, N.J.

[21] Appl. No.: 712,308

[22] Filed: Mar. 15, 1985

[51] Int. Cl.[4] .............................................. B32B 15/08
[52] U.S. Cl. .................................... 428/461; 428/901;
428/462; 428/463; 430/271; 430/277; 430/285;
430/275; 430/280; 430/284
[58] Field of Search ............... 430/271, 277, 275, 285,
430/280, 284; 428/461, 462, 463, 901

[56] References Cited

U.S. PATENT DOCUMENTS

| T889,027 | 8/1971 | Nadeau | 430/271 X |
|---|---|---|---|
| 2,978,356 | 4/1961 | Gomsi | 428/461 |
| 3,185,085 | 5/1965 | Herrick et al. | 430/271 X |
| 3,447,460 | 6/1969 | Vincent et al. | 428/461 X |
| 3,620,878 | 11/1971 | Guthrie | 428/461 X |
| 3,749,637 | 7/1973 | Reardon et al. | 428/461 X |
| 3,932,689 | 1/1976 | Watanabe et al. | 428/461 X |
| 3,948,665 | 4/1976 | Richter et al. | 430/271 |
| 4,079,159 | 3/1978 | Sano et al. | 428/461 X |
| 4,197,354 | 4/1980 | Sandera | 428/461 |
| 4,233,395 | 11/1980 | Klüpfel et al. | 430/271 |

Primary Examiner—Nancy A. B. Swisher
Attorney, Agent, or Firm—S. H. Parker; J. Matalon; R. Bright

[57] ABSTRACT

A printed circuit board having improved adhesion between solder mask and metal includes a primer film on the metal deposited from an aqueous solution which includes 0.01 to 10% by weight of a carboxyl-containing polymer or copolymer.

4 Claims, No Drawings

PRINTED CIRCUIT BOARDS HAVING IMPROVED ADHESION BETWEEN SOLDER MASK AND METAL

BACKGROUND OF THE INVENTION

1. Field of the Invention

This invention relates to printed circuit boards and, more particularly, to a u.v. curable solder mask coating over a substrate including a metal which has improved adhesion between the metal and mask.

2. Description of the Prior Art

Printed circuits are commonly based on rigid boards made of fiberglass impregnated with epoxy resins; or flexible boards which are based on sheet polyester and polyimides. Adhered to the board or sheet base is a metal layer, e.g. a copper layer—electrodeposited copper for rigid boards, rolled copper for flexible boards, on which the circuitry is printed and etched.

Coated over the board and metal is a solder mask polymeric coating which will mask the solder from attaching to the metal. Usually polymeric solder masks are thermally cured in order to provide adhesion between the mask and metal. However, recently, u.v. curable solder masks have been used for such printed circuit fabrication. Compared to thermally cured solder masks, u.v. curable solder masks do not have as good adhesion on metal substrates.

Baking a u.v. curable coating often can improve adhesion but this additional step is not desirable under production conditions. An alternative approach is to use adhesion promoters as additives in the u.v. circuit solder mask formulation. Unfortunately, adhesion polymers often have a significant impact on the shelf life, stability and/or overall performance of the u.v. curable solder mask. Particularly, such properties as electrical insulation resistance, hydrolytic stability, heat and chemical resistance and compatibility with the coating formulation may be affected by the presence of an adhesion promoter in the u.v. coating formulation.

Accordingly, it is an object of the present invention to provide a method of making a printed circuit board which includes a u.v. solder mask coating over a substrate including a metal in which the boards are characterized by excellent adhesion between mask and metal, particularly circuit boards which meet the IPC-SM-840A Class 3 standard for adhesion.

Another object of this invention is to provide such improved boards which otherwise retain all the advantageous properties and performance of the solder mask.

SUMMARY OF THE INVENTION

What is described herein is a method of making a printed circuit board which includes a u.v. solder mask coating on a substrate which include a metal such as copper, tin, tin-lead, tin-nickel, gold or nickel, in which the boards exhibit improved adhesion between metal and mask. The method comprises applying a primer film to the substrate from an aqueous solution which includes 0.1–10% by weight of a carboxyl-containing polymer or copolymer. Preferably the primer film is made by dipping the board into the solution, withdrawing and air drying, although other methods may be used as well, including spraying, brushing, and the like.

In the preferred embodiment of the invention, the solution includes 0.025–1% by weight of a butadiene-maleic acid copolymer, or its half-acid ester and the printed circuit boards produced thereby meet the IPC-SM-840A Class 3 standard for adhesion.

DETAILED DESCRIPTION OF THE INVENTION

In a typical procedure, a printed circuit board prior to solder masking is dipped in a tank containing 0.01 to 10%, preferably 0.025 to 1%, by weight, of a carboxyl-containing polymer or copolymer, selected from among: a polyacrylic acid polymer, an ethylene-maleic acid copolymer and its half-acid ester, a butadiene-maleic acid copolymer and its half-acid ester, and a styrene-maleic acid copolymer and its half-acid ester. Preferably the carboxyl-containing polymer or copolymer is a butadiene-maleic acid copolymer or its half-acid ester.

The printed circuit board then is removed from the dip tank and blown dry with compressed air. The u.v. solder mask is then applied and cured in the usual manner. Typical u.v. curable polymers include urethane acrylates and epoxy acrylates, although others known in the art may be used as well.

Finally, the solder itself is applied, generally by dip-soldering at a temperature up to about 550° F., although other soldering methods may be used, as for example, wave soldering, hot air and hot oil solder leveling, or roller thinning.

Following this procedure, printed circuit boards were made with and without the primer film and tested for their adhesion properties. The Table below shows the dramatic improvement in adhesion of a u.v. curable solder mask over copper and tin-lead with the primer treatment of this invention. Furthermore, the properties and performance of the solder mask remained unaffected by this treatment.

TABLE

ADHESION PROPERTIES OF BOARDS WITH AND WITHOUT PRIMER FILMS

| Film | Conc. (Wt. %) | Dip-Solder | 0.5% | 5–15% | 15–35% | 35–65% | 65–100% |
|---|---|---|---|---|---|---|---|
| | | | | | Adhesion on Copper[A] | | |
| — | — | before soldering | | | | X | |
| | | after soldering | | | | X | |
| DDMA-½ ester | 0.1 | before | | | | X | |
| | | after | | X | | | |
| BDMA-½ ester | 1 | before | | | | | X |
| | | after | X | | | | |
| BDMA | 0.1 | before | | | | X | |
| | | after | X | | | | |
| | | | | | Adhesion on Tin-Lead | | |
| — | — | before | | | | | X |
| | | after | | | | | X |
| DDMA-½ ester | 0.1 | before | | X | | | |

TABLE-continued
ADHESION PROPERTIES OF BOARDS WITH AND WITHOUT PRIMER FILMS

| Film | Conc. (Wt. %) | Dip-Solder | 0.5% | 5-15% | 15-35% | 35-65% | 65-100% |
|---|---|---|---|---|---|---|---|
| BDMA-½ ester | 1 | before | | X | | | |
|  |  | after | | | | | X |
| BDMA-½ ester | 0.1 | before | X | | | | |
|  |  | after | | | | | X |

[a]Cross-Hatch Tape Test - % Lift Off (IPC-SM-840A Class 3 Standard is 0-5% lift-off).
BDMA - butadiene-maleic acid copolymer-half ammonium salt.
DDMA ½ ester - butadiene-maleic acid copolymer-half ammonium salt.
Solder Mask - u.v. curable urethane acrylate.

The solder mask itself remains also unaffected by the application of dip solder thereon. It is also observed that even the severe hot air leveling method of soldering does not affect solder masks having a primer film under it.

What is claimed is:

1. A printed circuit board which exhibits excellent adhesion between mask and metal comprising:
   (a) a substrate which includes a metal,
   (b) a primer film on said substrate deposited from an aqueous solution which includes 0.01 to 10% by weight of a carboxyl-containing polymer or copolymer selected from the group consisting of a polyacrylic acid polymer, an ethylene-maleic acid copolymer or its half-acid ester, a butadienemaleic acid copolymer or its half-acid ester, and a styrene-maleic acid copolymer or its half-acid ester; and
   (c) a u.v. curable solder mask coating thereon, wherein said coating is a urethane acrylate or an epoxy acrylate.

2. A printed circuit board according to claim 1 in which the board meets the IPC-SM-840A-Class 3 standard for adhesion.

3. A printed circuit board according to claim 1 wherein the metal is copper, tin, tin-lead, tin-nickel, gold or nickel.

4. A printed circuit board according to claim 1 wherein said copolymer is a butadiene-maleic acid copolymer or its half-acid ester.

* * * * *